United States Patent [19]

Nicola et al.

[11] Patent Number: 4,912,424

[45] Date of Patent: Mar. 27, 1990

[54] AUDIO AMPLIFIER WITH VOLTAGE LIMITING

[75] Inventors: Liviu M. Nicola, Madison Heights; Henry F. Blind, Grosse Pointe Woods, both of Mich.

[73] Assignee: Ford Motor Company, Dearborn, Mich.

[21] Appl. No.: 365,278

[22] Filed: Jun. 12, 1989

[51] Int. Cl.⁴ .............................................. H23G 9/02
[52] U.S. Cl. ................................. 330/141; 330/124 R; 330/281; 330/295
[58] Field of Search ................... 330/2, 132, 133, 134, 330/141, 124 R, 281, 295

[56] References Cited

U.S. PATENT DOCUMENTS

| | | | |
|---|---|---|---|
| 3,518,566 | 6/1970 | Vogel | 330/132 X |
| 3,576,449 | 4/1971 | Howell | 330/145 X |
| 4,048,573 | 9/1977 | Evans et al. | 330/2 |
| 4,233,566 | 11/1980 | Nestorovic | 330/59 |
| 4,318,053 | 3/1982 | Sondermeyer | 330/281 |
| 4,581,589 | 4/1986 | Ikoma | 330/280 |
| 4,843,626 | 6/1989 | Werrbach | 381/107 |

OTHER PUBLICATIONS

"A Dual-Band Audio Limiter", Noble et al, Journal of the Audio Engineering Society, vol. 17, No. 6, Dec. 1969, pp. 678-684.
TDA7360 Data Sheet.
TDA1524A Data Sheet.

Primary Examiner—James B. Mullins
Attorney, Agent, or Firm—Mark L. Mollon; Paul K. Godwin

[57] ABSTRACT

A voltage limiting circuit is disclosed for preventing distortion in amplified audio signals. Clipping of the output of a power amplifier is detected and a clipping signal is integrated in a two-step process for limiting a bass frequency gain and limiting a wideband frequency gain which are applied in series. Separate limiting thresholds cause the bass gain to be limited first. Wideband gain is reduced at higher levels of clipping but is more quickly restored when clipping stops. Voltage limiting feedback is provided using inexpensive RC integrator circuits.

13 Claims, 3 Drawing Sheets

AUDIO AMPLIFIER WITH VOLTAGE LIMITING

BACKGROUND OF THE INVENTION

The present invention relates in general to audio systems which prevent distortion from amplifier clipping by employing voltage limiting, and more specifically to automotive audio systems using at least two voltage limiting feedback loops for different frequency ranges in the audio spectrum.

Typical audio reproduction systems include a variable-gain amplification stage followed by a fixed-gain power amplifier which feeds an output transducer such as a speaker. A control voltage provided to the variable gain stage controls the output volume heard by a listener. The variable gain stage usually includes a tone control for varying the relative amplification of bass and/or treble frequency ranges.

An important objective in designing an audio system is to provide minimum distortion in signal reproduction. However, there is always some distortion, especially at high sound levels. As the magnitude of the signal provided from the variable gain amplifier stage to the power amplifier increases above a certain level, the power amplifier becomes overdriven. This situation occurs when the input signal to the power amplifier multiplied by the fixed gain of the power amplifier approaches the supply voltage level provided to the power amplifier. As a result, the power amplifier becomes saturated and signal peaks of the audio signal are distorted by clipping.

The problem of power amplifier clipping is more severe in automotive audio systems. Less voltage headroom (i.e., safety margin) is available to the power amplifier since the automobile is limited to a 12-volt electrical supply. Although a DC/DC converter can be used to obtain a higher DC voltage, such converters are relatively expensive. Also, bass boost is needed in the automotive environment to mask low frequency road and engine noise, making clipping more likely in the bass range of the audio signal.

It is known to employ voltage limiting or compression to the input of an amplifier to prevent clipping. In Evans et al, U.S. Pat. No. 4,048,573, a high fidelity audio amplifier compares the amplifier input to the amplifier feedback signal. The input signal is attenuated when any excessive signal in either the input or the feedback is detected. The resulting amplifier is wideband limited, i.e., even though the large amplitude signals causing limiting may be substantially only within a restricted range of frequencies, all frequencies are attenuated which results in a "breathing" effect. Thus, a loud bass signal can cause the reduction in volume of a quieter treble signal.

In Mestorovic, U.S. Pat. No. 4,233,566, the power amplifier output signal is compared to a predetermined reference. When the output signal exceeds the reference, a voltage controlled attenuator reduces the input signal to the power amplifier. This system is likewise subject to the breathing effects caused by its wideband approach.

Sondermeyer, U.S. Pat. No. 4,318,053, discloses an amplifier which reduces the amplifier gain when clipping reaches a certain threshold. A threshold detector charges a capacitor which may then be discharged into a variable gain amplifier according to the percent of clipping of the output signal of the amplifier. This system has the disadvantages that limiting is performed over the entire frequency range of the amplifier even upon the occurrence of a large amplitude signal of narrow frequencies.

The paper Noble et al, *A Dual-Band Audio Limiter,* Journal of the Audio Engineering Society, Vol. 17, No. 6, December 1969, pages 678–684, describes a limiting system in which the audio signal is split into separate paths for bass frequencies and higher frequencies. Gain in each path is reduced upon the occurrence of a peak level, the reduced gain being maintained for the recovery time of the limiter. Noble et al point out that recovery time should be short in order to minimize dynamic distortion. However, harmonic distortion and intermodulation distortion require a longer release time to minimize the distortion. Noble et al deals with these conflicting results by providing different release times in each path. Thus, distortion is reduced for bass frequencies by providing a longer release time, while distortion at higher frequencies is minimized by a short release time. However, the threshold for initiating limiting is the same in each band of frequencies.

The dual-band limiter in Noble et al has the problem that a phase splitter and band pass filters are required to separate the audio signal into separate bands and that the separate bands must be mixed together in the output. These elements add their own distortion to the signal and expense to the amplifier.

SUMMARY OF THE INVENTION

Accordingly, it is a principal object of the present invention to provide a method and apparatus for amplifying an audio signal without power amplifier clipping and without the perception of "breathing" where non-clipping frequencies are attenuated due to the clipping in another frequency range.

It is another object of the invention to increase the amount of perceived audio power available in an automotive audio system.

It is a further object of the invention to provide voltage limiting for an audio signal without requiring band splitting of the audio signal.

These and other objects are achieved by an apparatus for amplifying an audio signal which comprises voltage controlled amplification means for applying a first gain to a wideband frequency range of the audio signal in response to a volume control signal and for applying a second gain to a limited frequency range of the audio signal in response to a tone control signal. Volume input means is coupled to the voltage control amplification means for generating the volume control signal in response to a user input. Tone input means is coupled to the voltage controlled amplification means for generating the tone control signal in response to a user input. A power amplifier is coupled to the output of the voltage controlled amplification means. Clip detecting means is coupled to the power amplifier and generates a clip signal indicative of the occurrence of clipping in the power amplifier. Volume loop means is coupled between the clip detecting means and the voltage controlled amplification means for altering the volume control signal so as to reduce the first gain in proportion to a first time integral of the clipping signal. Tone loop means is coupled between the clip detecting means and the voltage controlled amplification means for altering the tone control signal so as to reduce the second gain in proportion to a second time integral of the clipping signal. Whenever clipping occurs, the second time integral causes a reduction of the second gain before the first integral causes a reduction of the first gain.

The invention also includes a method for voltage limiting an amplified audio signal comprising the steps of (i) detecting the occurrence of clipping during the amplification of an audio signal; (ii) voltage limiting a wideband frequency portion of the audio signal in response to clipping in excess of a first integration threshold; and (iii) voltage limiting a limited frequency portion of the audio signal in response to clipping in excess of a second integration threshold lower than the first integration threshold.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

DETAILED DESCRIPTION OF PREFERRED EMBODIMENTS

Figure 1:
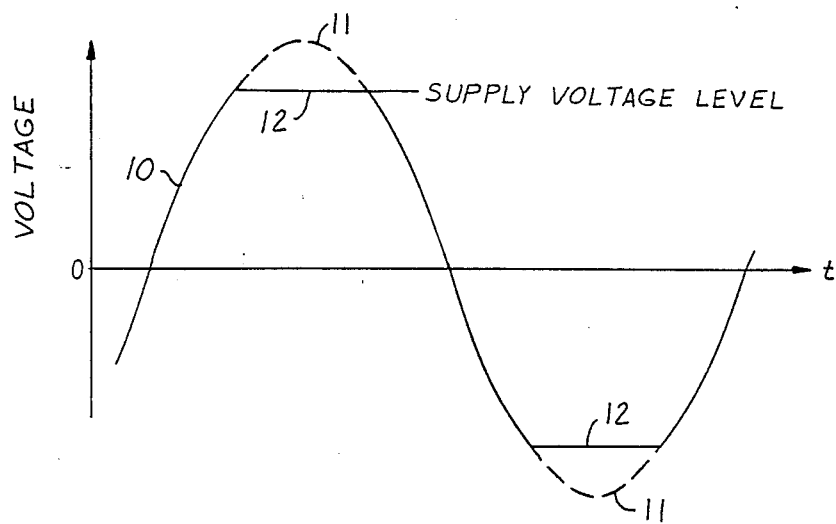
FIG. 1 is a waveform diagram showing the effects of clipping.

Referring now to FIG. 1, a voltage waveform 10 is shown to illustrate the effects of amplifier clipping. The audio input signal to a power amplifier has an amplitude which overdrives the power amplifier and causes its output to be clipped over the period shown at 12 rather than providing a desired waveform 11.

Figure 2:
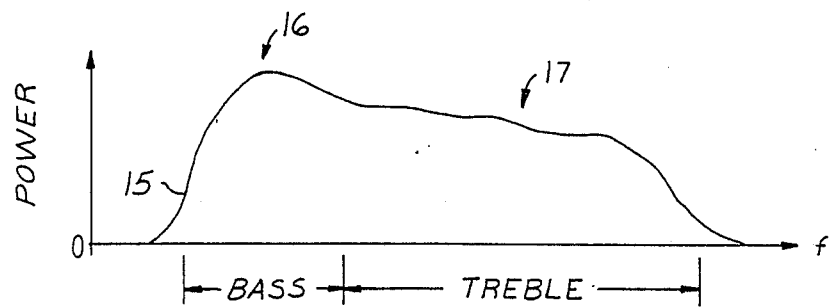
FIG. 2 is a plot showing the frequency content of an exemplary audio signal.

FIG. 2 shows a typical frequency power spectrum of an audio program as reproduced in an automobile. Thus, spectrum 15 has a bass boost in the bass range 16 greater than the average level of the treble content in treble range 17. The use of prior art wideband limiting to the entire spectrum of this type of signal has created excessive "breathing" in the program material and apparent reduction in the total output power available to the audio system.

Figure 3:
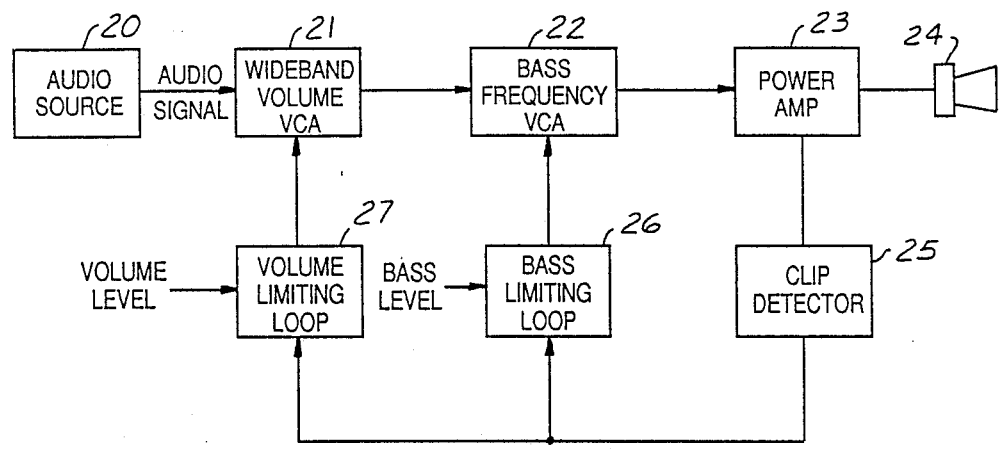
FIG. 3 is a block diagram showing a first embodiment of a voltage limiting arrangement of the invention.

A preferred embodiment of the invention is shown in FIG. 3 to include an audio source 20 providing an audio signal to a wideband volume voltage controlled amplifier (VCA) 21. The signal is further amplified by a bass frequency VCA 22 and a power amplifier 23 prior to being output to a speaker 24. A clip detector 25 is connected to power amplifier 23 for sensing the onset of clipping distortion. A clip signal from clip detector 25 is coupled to a bass limiting loop 26 and a volume limiting loop 27. Bass limiting loop 26 receives a bass level control voltage under operator control. The output of bass limiting loop 26 is connected to the voltage controlled input of bass frequency VCA 22. Likewise, volume limiting loop 27 receives a volume level control voltage and provides an output to the voltage controlled input of wideband volume VCA 21.

In operation, an audio signal provided to wideband volume VCA 21 is wideband amplified to provide a desired gain. The wideband amplified signal is provided to bass frequency VCA 22 which applies a further gain to the bass frequency portion of the audio signal while leaving the mid-range/high frequency portion of the audio signal substantially unchanged.

In the absence of clipping, the volume level control voltage and the bass level control voltage are passed directly to the voltage controlled inputs of wideband volume VCA 21 and bass frequency VCA 22, respectively. When clipping occurs, these level control voltages will be reduced by the limiting loops.

The limiting loops provide independent activating thresholds such that voltage limiting caused by large amplitude bass signals do not cause breathing of the total audio signal. Thus, once a first threshold of severity of clipping (e.g., a time integral of the time during which clipping is detected) is indicated by clip detector 25, bass limiting loop 26 begins to reduce the voltage applied to the voltage controlled input of bass frequency VCA 22. As a result, the bass boost in the audio signal is removed. This is acceptable, since the sensitivity of the ear is greater to low frequencies at high signal levels. With the gain of bass frequency VCA 22 reduced, high input signal levels due to large wideband gain may still cause clipping as detected by clip detector 25.

A higher integration threshold for the continued clipping at high signal levels is employed by volume limiting loop 27. Thus, the volume level control voltage supplied to the voltage controlled input of wideband volume VCA 21 is reduced in response to clipping signals caused by program content anywhere in the audio frequency range of the system, including the bass range.

A further feature of the limiting loops of FIG. 3 resides in their separate release times. Thus, once the amount of clipping detected by clip detector 25 falls below the limiting threshold of volume limiting loop 27, the volume level command voltage set by the user returns to the wideband volume VCA 21 almost immediately. In contrast, bass limiting loop 26 maintains limiting of the bass frequency range after clipping falls below the lower threshold for a relatively long time period such as about 0.1 second or longer. This avoids harmonic distortion in the audio signal.

Bass limiting loop 26 and volume limiting loop 27 preferably take the form of integrator circuits such that their respective level command voltages are altered in proportion to time integrals of the clipping signal. In other words, the bass level command is deintegrated during times that the clip detector 25 signals the occurrence of clipping and is reintegrated to the level set by the user after clipping ceases. Likewise, the volume level is deintegrated when the threshold of volume limiting loop 27 is reached, but the reduction of voltage occurs at a slower rate. Reintegration of the volume level occurs more quickly in volume limiting loop 27 due to its shorter release time.

Figure 4:
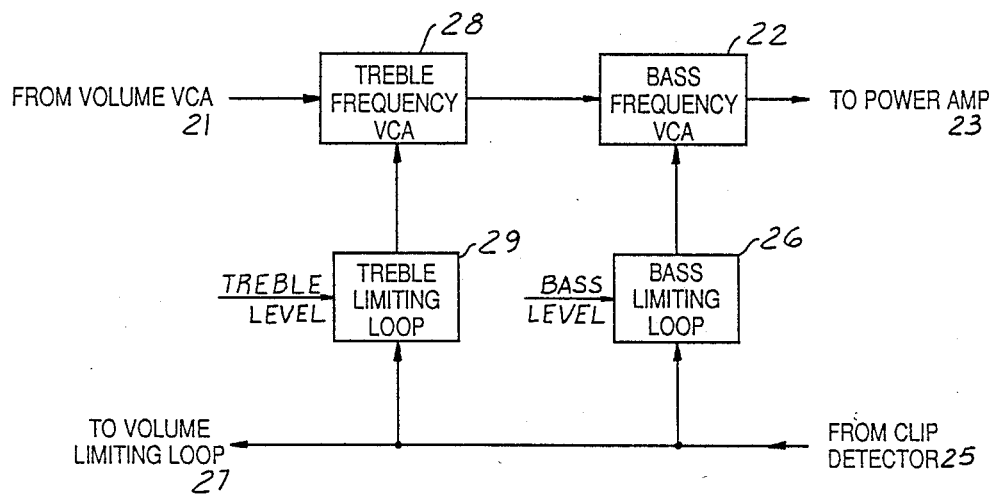
FIG. 4 is a block diagram showing an alternative embodiment of the invention.

As shown in FIG. 4, a third voltage limiting feedback mechanism can be included for mid-range/high frequencies which operates in a manner similar to the bass limiting loop. Thus, a treble frequency VCA 28 receives the wideband volume controlled amplifier signal and provides a selectable gain to the treble frequencies while leaving bass frequencies unchanged. A treble limiting loop 29 receives the clipping signal from clip detector 25 and receives a treble level command voltage under control of the audio system user. The limiting threshold and the release time of treble limiting loop 29 would each be intermediate of those for the volume limiting loop and the bass limiting loop. This embodiment provides a more natural spectral balance under limiting conditions in the amplification of the audio signal.

Figure 5:
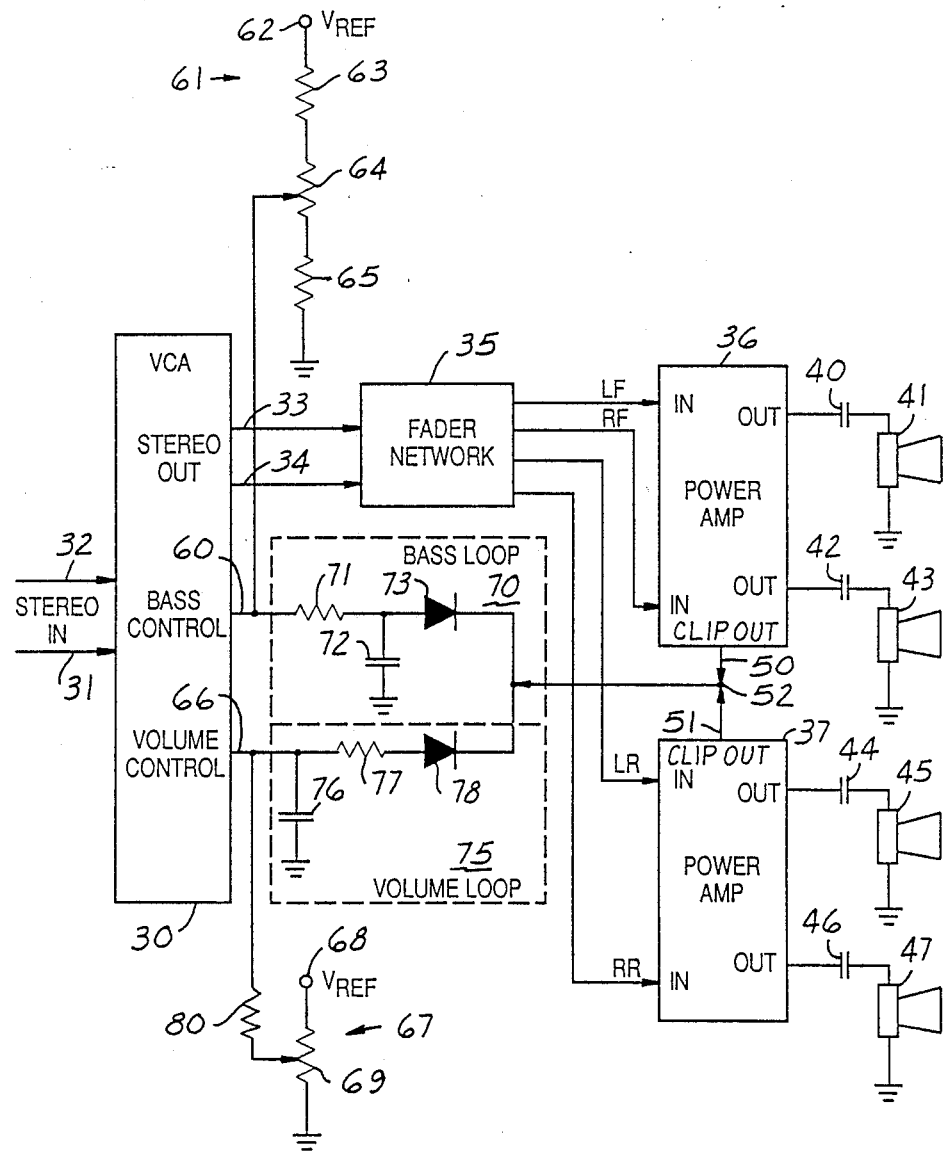
FIG. 5 is a part block diagram, part schematic diagram showing the present invention in greater detail.

Referring to FIG. 5, a detailed implementation of the present invention is shown to include a VCA 30 which may preferably comprise the TDA 1524A stereo tone/-volume control circuit manufactured by Philips. VCA 30 receives a stereo pair of audio inputs 31 and 32 from an audio source (not shown). Stereo outputs 33 and 34 are provided after serially passing through a volume controlled amplifier and bass and treble controlled amplifiers therein. Stereo outputs 33 and 34 are coupled to a fader network 35 for generating front and rear, left and right channels using a conventional bridge circuit, for example. The front stereo signals are provided to a pair of inputs in a power amplifier 36. The rear stereo signals are provided to a pair of inputs in a power amplifier 37. Power amplifiers 36 and 37 can preferably be comprised of an integrated circuit TDA 652 which is a stereo/bridge amplifier with clipping detector manufactured by SGS/Thomson Microelectronics. The amplified outputs of power amplifier 36 are coupled to a pair of speakers 41 and 43 through a pair of coupling capacitors 40 and 42, respectively. The amplified outputs of power amplifier 37 are provided to speakers 45 and 47 through coupling capacitors 44 and 46, respectively. Clip detector outputs 50 and 51 of amplifiers 36 and 37, respectively, are connected at a junction 52 which is coupled to a bass loop 70 and a volume loop 75.

VCA 30 includes a bass control input 60 which is connected to a bass control voltage source 61. VCA 30 also includes a volume control input 66 which is coupled to a volume control voltage source 67. Bass control source 61 includes a terminal 62 receiving a reference voltage $v_{ref}$, a pair of resistors 63 and 65 and a potentiometer 64 all connected in series. The adjustable wiper of potentiometer 64 is connected to bass control input 60. By varying the setting of potentiometer 64, a user controls the bass gain of VCA 30. Likewise, volume control source 67 includes a terminal 68 receiving reference voltage $v_{ref}$ and a potentiometer 69 connected between terminal 68 and ground. The adjustable wiper of potentiometer 69 is coupled to volume control input 66 through a coupling resistor 80, thus allowing the user to control the volume gain of VCA 30.

Bass loop 70 includes a resistor 71 having one end connected to bass control input 60 and its other end coupled to ground through a capacitor 72. The junction of resistor 71 and capacitor 72 is coupled to clipping detector junction 52 through a unidirectional device such as a diode 73 for allowing current to flow from the RC integrator formed by resistor 71 and capacitor 72 to clip detector outputs 50 and 51.

Volume loop 75 includes a capacitor 76 connected between volume control input 66 and ground. A resistor 77 is connected between capacitor 76 and the anode of a diode 78 which has its cathode connected to clipping detector junction 52.

In operation, power amplifiers 36 and 37 provide a fixed gain amplification of the stereo audio signals until the onset of clipping. Preferably, clipping detector outputs 50 and 51 comprise current sinks which provide a path to ground when clipping is detected.

When there is no clipping, the voltage signals provided by the user controls 61 and 67 are stored by capacitors 72 and 76, respectively. In other words, each capacitor integrates the control voltage until the capacitor voltage equals the control voltage. When clipping occurs, clipping detector junction 52 is connected to ground and becomes a current sink, thus turning on (i.e., forward biasing) diodes 73 and 78. Since capacitor 72 discharges only through diode 73, it rapidly deintegrates the voltage provided to bass control 60. Since capacitor 76 discharges through resistor 77 and diode 78, it reduces the volume control voltage at 66 more slowly, thus causing a higher integration threshold for reduction of wideband gain in VCA 30. Subsequently, when clipping ceases and clipping detector junction 52 no longer provides a current sink, diodes 73 and 78 turn off (i.e., are reverse biased) causing capacitors 72 and 76 to reintegrate the control voltages. Since capacitor 76 charges directly from potentiometer 69 and resistor 80, the control voltage at volume control 66 is restored with a shorter release time than the voltage at bass control 60 because capacitor 72 recharges through resistor 71 which is selected to have a greater resistance than resistor 80.

VCA 30 further includes a treble control input (not shown) which is controlled by a treble control potentiometer (not shown). A treble limiting loop may be included of similar form such that its charging rate is intermediate the charging rates of bass loop 70 and volume loop 75 and its discharging rate is intermediate the discharging rates of bass loop 70 and volume loop 75. The treble loop would further be coupled to clip detecting junction 52 through a diode. A treble limiting loop could, for example, include a pair of series connected resistors having a capacitor coupled between the junction of the resistors and ground. Thus, the capacitor would be charged through one resistor and discharged through the other resistor, thus giving the intermediate charging and discharging rates.

The foregoing describes an automotive audio system including voltage limiting which prevents clipping of the power amplifier output while avoiding breathing effects and avoiding any perception of decreased audio power. Voltage limiting is also achieved without a perception of reduced bass content in the audio signal due to a two-step limiting approach which first removes any bass emphasis and then causes further limiting of the wideband signal in response to the continued occurrence of clipping signals. Furthermore, limiting is achieved with inexpensive components and without phase splitting or band filtering.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. Apparatus for amplifying an audio signal comprising:
   voltage controlled amplification means for applying a first gain to a wideband frequency range of said audio signal in response to a volume control signal and for applying a second gain to a limited frequency range of said audio signal in response to a tone control signal;
   volume input means coupled to said voltage controlled amplification means for generating said volume control signal in response to a user input;

tone input means coupled to said voltage controlled amplification means for generating said tone control signal in response to a user input;

a power amplifier coupled to said voltage controlled amplification means;

clip detecting means coupled to said power amplifier for generating a clip signal indicative of the occurrence of clipping in said power amplifier;

volume loop means coupled between said clip detecting means and said voltage controlled amplification means for altering said volume control signal so as to reduce said first gain in proportion to a first time integral of said clipping signal; and tone loop means coupled between said clip detecting means and said voltage controlled amplification means for altering said tone control signal so as to reduce said second gain in proportion to a second time integral of said clipping signal, said time integrals causing a reduction of said second gain prior to causing a reduction of said first gain when clipping occurs.

2. The apparatus of claim 1 wherein said volume loop means maintains said first gain at a reduced value for a first release time after the discontinuance of said clip signal and wherein said tone loop means maintains said second gain at a reduced value for a second release time after the discontinuance of said clip signal, said first release time being less than said second release time.

3. The apparatus of claim 2 wherein said volume loop means includes a first integrator and wherein said tone loop means includes a second integrator.

4. The apparatus of claim 3 wherein said volume loop means and said tone loop means further comprise first and second unidirectional devices, respectively, for coupling said respective integrators to said clip detecting means.

5. The apparatus of claim 1 wherein said limited frequency range corresponds to a bass portion of said audio signal.

6. Apparatus for amplifying an audio signal comprising:

a voltage controlled amplifier circuit receiving said audio signal, said voltage controlled amplifier circuit having a volume control input and a bass control input for controlling wideband signal gain and bass signal gain, respectively, of said audio signal;

a volume control voltage source connected to said volume control input;

a bass control voltage source connected to said bass control input;

power amplifier means coupled to the output of said voltage controlled amplifier circuit for applying a fixed gain to said audio signal after application of said wideband signal gain and said bass signal gain;

clip detecting means coupled to said power amplifier means for providing a current sink in reponse to the occurrence of clipping;

a first integrator coupled to said volume control input for receiving charge from said volume control voltage source;

a first unidirectional device coupling said first integrator to said current sink for removing charge from said first integrator during the occurrence of clipping;

a second integrator coupled to said bass control input for receiving charge from said bass control voltage source; and a second unidirectional device coupling said second integrator to said current sink for removing charge from said second integrator during the occurrence of clipping.

7. The apparatus of claim 6 wherein said first integrator has a faster charging rate than said second integrator.

8. The apparatus of claim 6 wherein said first integrator has a slower discharging rate than said second integrator.

9. The apparatus of claim 7 wherein said first integrator has a slower discharging rate than said second integrator.

10. The apparatus of claim 6 wherein said volume control voltage source includes a volume control potentiometer and wherein said bass control voltage source includes a bass control potentiometer.

11. The apparatus of claim 6 wherein said audio signal is a stereo signal and wherein said power amplifier means provides front and rear stereo audio output signals, said apparatus further comprising a fader network coupling said voltage controlled amplifier circuit and said power amplifier means.

12. A method for voltage limiting an amplified audio signal comprising the steps of:

detecting the occurrence of clipping during the amplification of said audio signal;

voltage limiting a wideband frequency portion of said audio signal in response to clipping in excess of a first integration threshold; and voltage limiting a limited frequency portion of said audio signal in response to clipping in excess of a second integration threshold lower than said first integration threshold.

13. The method of claim 12 further comprising the steps of:

maintaining said limiting of said wideband frequency portion for a first release time after said clipping drops below said first integration threshold; and maintaining said limiting of said limited frequency portion for a second release time after said clipping drops below said second integration threshold, said second release time being longer than said first release time.

* * * * *